US012777657B2

(12) United States Patent
Chang et al.

(10) Patent No.: US 12,777,657 B2
(45) Date of Patent: Oct. 27, 2026

(54) HIGH ENDURANCE SUPER-LATTICE ANTI-FERROELECTRIC CAPACITORS

(71) Applicant: Intel Corporation, Santa Clara, CA (US)

(72) Inventors: Sou-Chi Chang, Portland, OR (US); Nazila Haratipour, Portland, OR (US); Christopher Neumann, Portland, OR (US); Shriram Shivaraman, Hillsboro, OR (US); Brian Doyle, Portland, OR (US); Sarah Atanasov, Beaverton, OR (US); Bernal Granados Alpizar, Beaverton, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 90 days.

(21) Appl. No.: 17/957,560

(22) Filed: Sep. 30, 2022

(65) Prior Publication Data

US 2024/0114695 A1 Apr. 4, 2024

(51) Int. Cl.

| | |
|---|---|
| ***H01L 27/11507*** | (2017.01) |
| ***H10B 51/00*** | (2023.01) |
| ***H10B 51/20*** | (2023.01) |
| ***H10B 51/30*** | (2023.01) |
| ***H10B 53/20*** | (2023.01) |
| ***H10B 53/30*** | (2023.01) |
| *H01G 4/06* | (2006.01) |
| *H01G 4/10* | (2006.01) |
| *H01G 4/12* | (2006.01) |
| *H01G 4/33* | (2006.01) |
| *H10B 12/00* | (2023.01) |

(52) U.S. Cl.
CPC ............. *H10B 53/30* (2023.02); *H10B 51/00* (2023.02); *H10B 51/20* (2023.02); *H10B 51/30* (2023.02); *H10B 53/20* (2023.02); *H01G 4/06* (2013.01); *H01G 4/10* (2013.01); *H01G 4/12* (2013.01); *H01G 4/33* (2013.01); *H10B 12/00* (2023.02); *H10B 12/02* (2023.02); *H10B 12/30* (2023.02)

(58) Field of Classification Search
CPC ........ H10B 53/30; H10B 53/00; H10B 53/20; H10B 51/00; H10B 51/20; H10B 51/30; H10B 12/00; H10B 12/02; H10B 12/30; H01G 4/06; H01G 4/10; H01G 4/12; H01G 4/33
See application file for complete search history.

(56) References Cited

U.S. PATENT DOCUMENTS

2020/0395460 A1* 12/2020 Haratipour ........... H10D 64/689
2021/0066587 A1* 3/2021 Trinh .................. H10N 70/826

OTHER PUBLICATIONS

Yu et al., "CeO2 Doping of Hf0.5Zr0.5O2 Thin Films for High Endurance Ferroelectric Memories", Advanced Electronic Materials, Mar. 18, 2022 (Year: 2022).*

* cited by examiner

*Primary Examiner* — Ermias T Woldegeorgis
(74) *Attorney, Agent, or Firm* — Essential Patents Group, LLP

(57) ABSTRACT

Apparatuses, memory systems, capacitor structures, and techniques related to anti-ferroelectric capacitors having a cerium oxide doped hafnium zirconium oxide based anti-ferroelectric are described. A capacitor includes layers of hafnium oxide, cerium oxide, and zirconium oxide between metal electrodes. The cerium of the cerium oxide provides a mid gap state to protect the hafnium zirconium oxide during operation.

20 Claims, 10 Drawing Sheets

HIGH ENDURANCE SUPER-LATTICE ANTI-FERROELECTRIC CAPACITORS

BACKGROUND

Ferroelectric and anti-ferroelectric memory devices such as random access memory (RAM) use ferroelectric or anti-ferroelectric materials in place of the dielectric material deployed in the capacitor of a typical dynamic random access memory (DRAM). Such ferroelectric and anti-ferroelectric memory devices have promising characteristics such as lower power usage, fast write performance, and others. However, difficulties arise in deploying ferroelectric and anti-ferroelectric material systems. For example, hafnium-based ferroelectric memory used in high-speed high-density memory applications has difficulty meeting the high endurance required in some applications (e.g., at least $\sim 10^{12}$ read/write endurance cycles). Currently, anti-ferroelectric memory devices using hafnium zirconium oxide may be used to mitigate dielectric breakdown by lowering operating voltage and lanthanum doped hafnium zirconium oxide ferroelectrics may be used to enhance dielectric breakdown properties. However, anti-ferroelectric hafnium zirconium oxide films still exhibit defect states that cause dielectric breakdown and lanthanum doped hafnium zirconium oxides require undesirable high operation voltages.

It is with respect to these and other considerations that the present improvements have been needed. Such improvements may become critical as the desire to deploy advanced memory solutions becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
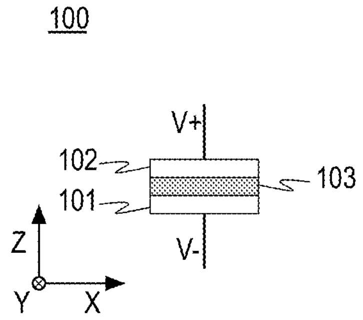
FIG. 1A illustrates a schematic of an example anti-ferroelectric capacitor.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "predominantly" indicates not less than 50% of a particular material or component while the term "substantially pure" indicates not less than 99% of the particular material or component. Unless otherwise indicated, such material percentages are based on atomic percentage. As used herein, the terms "monolithic", "monolithically integrated", and similar terms indicate the components of the monolithic overall structure form a indivisible whole not reasonably capable of being separated.

Apparatuses, systems, capacitor structures, and techniques are described herein related to anti-ferroelectric capacitors deploying a cerium oxide doped hafnium zirconium oxide ferroelectric material for increased memory endurance.

As discussed, it is desirable to deploy anti-ferroelectric capacitors having high endurance (e.g., at least ~$10^{12}$ read/write endurance cycles). Such endurance is defined by the ability of the device to operate and not break down even after the defined number of read/write cycles. Typical hafnium zirconium oxide ferroelectric and anti-ferroelectric capacitors are not capable of attaining such endurance needs. By deploying cerium oxide doped hafnium zirconium oxide in the context of anti-ferroelectric capacitor material systems, increased capacitor endurance is achieved. Such anti-ferroelectric capacitors may be deployed, for example, in high-speed high-density memory applications for improved performance.

FIG. 1A illustrates a schematic of an example anti-ferroelectric capacitor 100, arranged in accordance with at least some implementations of the present disclosure. As shown in FIG. 1A, anti-ferroelectric (AFE) capacitor 100 includes an AFE material stack 103 between electrodes 101, 102. As discussed in detail herein, AFE material stack 103 may include a multilayer stack including one or more layers of hafnium oxide ($HfO_2$), one or more layers of cerium oxide ($CeO_2$), and one or more layers of zirconium oxide ($ZrO_2$). In some embodiments, AFE, material stack 103 is a super-lattice AFE material stack. As used herein, the term super-lattice indicates a periodic structure of layers of two or more materials. For example, AFE material stack 103 may be a periodic structure including repeating multilayer stacks, each stack including a cerium oxide layer on a hafnium oxide layer and a zirconium oxide layer on the cerium oxide layer. AFE capacitor 100 may also include interfacial layers between AFE material stack 103 and each of electrodes 101, 102. The multi-layer nature of AFE material stack 103 and such interfacial layers are not illustrated in FIG. 1A for the sake of clarity of presentation.

Figure 1B:
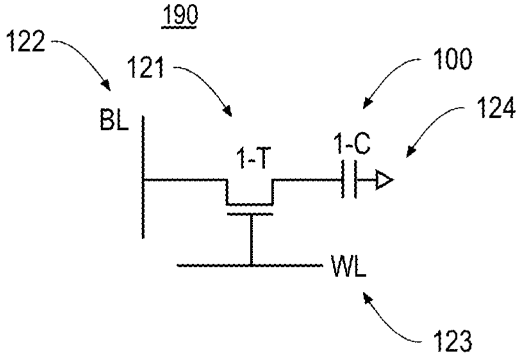
FIG. 1B illustrates a diagram of an example memory cell circuit.

FIG. 1B illustrates a diagram of an example memory cell circuit 190, arranged in accordance with at least some implementations of the present disclosure. As shown in FIG. 1B, AFE capacitor 100 may be deployed in memory cell circuit 190, which provides a one capacitor-one transistor (1C-1T) architecture. Such 1C-1T architectures may be deployed in a variety of contexts including capacitor over bit line (COB) architectures (e.g., deep trench architectures), 3D array memory device architectures (e.g., vertically stacked capacitor architectures), or others. As shown, memory cell circuit 190 includes AFE capacitor 100 and a transistor 121. Transistor 121 may have any suitable architecture. For example, transistor 121 may be a planar field effect transistor (FET), a FinFET, a gate all around (GAA) transistor (GAA-FET), or other. The gate of transistor 121 is controlled via a word line 123 and the source/drain of transistor 121 are coupled to AFE capacitor 100 and a bit line 122. AFE capacitor 100 is further coupled to a ground 124.

As discussed, in some contexts, memory devices may deploy a ferroelectric material. However, such devices require a relatively large bipolar operating voltage, which can cause device breakdown.

Figure 1C:
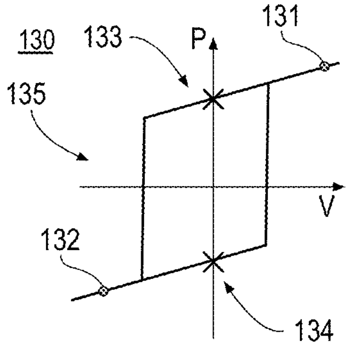
FIG. 1C illustrates a plot showing polarization versus voltage for a capacitor deploying a ferroelectric material.

FIG. 1C illustrates a plot 130 showing polarization versus voltage for a capacitor deploying a ferroelectric material, arranged in accordance with at least some implementations of the present disclosure. Unlike a typical dielectric based capacitor, a ferroelectric capacitor uses polarization charge to store the memory states, where a positive polarization charge state 133 indicates, for example, a stored bit of "1" and a negative polarization charge state 134, indicate, for example, a stored bit of "0". Plot 130 illustrates the hysteresis property of a ferroelectric material based capacitor. A ferroelectric material exhibits ferroelectricity, which is a property by which a spontaneous electric polarization can be revered by an electric field (e.g., applied voltage). For example, when a dielectric material is polarized, the induced polarization is proportional to the applied external electric field. Ferroelectric materials, on the other hand, demonstrate a spontaneous non-zero polarization even when the applied electric field is zero. As such, the spontaneous polarization may be reversed by an applied electric field in the opposite direction. This results in a hysteresis loop 135 because the polarization of a ferroelectric material is dependent not only on the present electric field but also on its history. Hysteresis loop 135 of plot 130 shows two stable operating positions or states for a ferroelectric capacitor, as discussed above: positive polarization charge state 133 and negative polarization charge state 134. These stable charge states 133, 134 indicate that the direction of polarization can be switched from one to another by application, for example, of positive switching voltage 131 and negative switching voltage 132.

However, disadvantageously, positive switching voltage 131 may be about +2.5V for hafnium zirconium oxide (HZO) ferroelectric materials. Negative switching voltage 132 may be about −2V to −2.5V, which results in a large bipolar voltage, and, in turn, kills the device during operation, rendering it unable to meet high endurance needs. As discussed, lanthanum doping can mitigate such concerns but may result in even higher voltage operations, which is not compatible with a number of memory applications such as embedded memory and more advanced technology nodes.

As discussed, AFE capacitor 100 advantageously deploys AFE material stack 103, which may be operated at a lower voltage. AFE material stack 103 may include one or more multilayer stacks that each include a hafnium oxide layer, a cerium oxide layer, and a zirconium oxide layer, as detailed below.

Figure 1D:
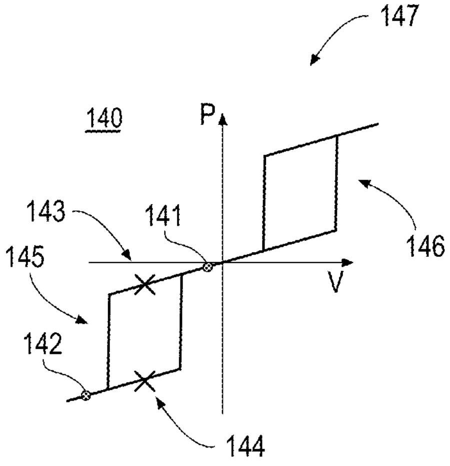
FIG. 1D illustrates a plot showing polarization versus voltage for a capacitor deploying an anti-ferroelectric material.

FIG. 1D illustrates a plot 140 showing polarization versus voltage for a capacitor deploying an anti-ferroelectric material, arranged in accordance with at least some implementations of the present disclosure. As shown in FIG. 1D, in contrast to a ferroelectric material, for an anti-ferroelectric (AFE) material, an AFE capacitor behavior having a double hysteresis loop 147 is observed due to the AFE material having an ordered array of electric dipoles but oriented in opposite (antiparallel) directions (in contrast to ferroelectric materials having spontaneous electric polarization due to changes in strengths of the dipoles). As used herein, the terms AFE and AFE materials indicate a material (at the bulk level, which may include multiple materials or material layers) having such material properties. The AFE characteristic may be realized in HZO by increasing zirconium concentration.

Double hysteresis loop 147 includes a first hysteresis loop 145 and a second hysteresis loop 146. First hysteresis loop 145 (as illustrated here) or second hysteresis loop 146 may be utilized or harvested for operation of AFE capacitor 100 while the other loop is not used (e.g., its characteristics are not of interest in the operation of AFE capacitor 100. Similar to hysteresis loop 135, first hysteresis loop 145 has stable polarization charge states 143, 144, that may be used to indicate stored bits. These stable states 143, 144 indicate that the direction of polarization can be switched from one to another by application, for example, of switching voltage 141 and switching voltage 142.

Figure 1E:
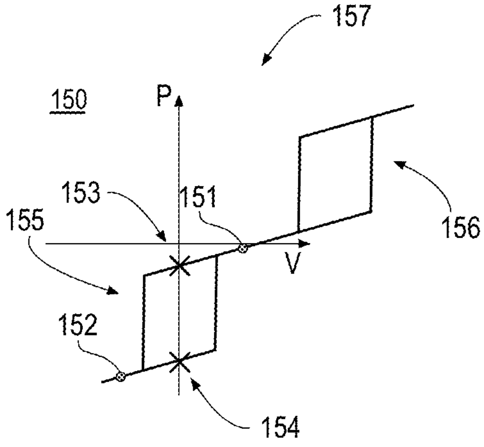
FIG. 1E illustrates a plot showing polarization versus voltage for a capacitor deploying an anti-ferroelectric material after voltage shift.

FIG. 1E illustrates a plot 150 showing polarization versus voltage for a capacitor deploying an anti-ferroelectric material after voltage shift, arranged in accordance with at least some implementations of the present disclosure. As shown in FIG. 1E, in contrast to double hysteresis loop 147, double hysteresis loop 157 is shifted such that stable polarization charge states 153, 154 are at 0V to enable improved device operation. Such shifting may be provided using any suitable technique or techniques such as selection of different metal materials for electrodes 101, 102, as is known in the art. Double hysteresis loop 157 first and second hysteresis loops, 155, 156, with first hysteresis loop 155 used for operation of AFE capacitor 100. Notably, switching voltages 151, 152, and the difference between them, are reduced with respect to those discussed with respect to ferroelectric capacitors (refer to FIG. 1C), which greatly reduces breakdown in AFE capacitors 100. For example, AFE capacitors 100 may be operated at lower voltages for improved reliability and endurance.

Although operation of AFE capacitors 100 at reduced voltages improves reliability and endurance, difficulties remain in use of HZO AFE dielectrics. In particular, HZO AFE dielectrics may still break down short of the high endurance needed in some applications (e.g., at least $\sim 10^{12}$ read/write endurance cycles). As discussed, in some embodiments, AFE capacitor 100 includes a hafnium oxide layer, a cerium oxide layer, and a zirconium oxide layer to provide a cerium oxide doped super-lattice AFE material. Notably, use of cerium introduces additional gap states (e.g., mid gap states or mid bandgap states) to reduce damage from Joule heating to the host HZO layers or films. The mid gap states from cerium are close to the Fermi level of titanium nitride (TiN) and, in some embodiments, electrode 101, electrode 102, or both have a layer of titanium nitride adjacent to the cerium oxide doped super-lattice AFE material such that efficient electron injections from the titanium nitride to the cerium protect the host hafnium oxide and zirconium oxide layers.

Figure 2:
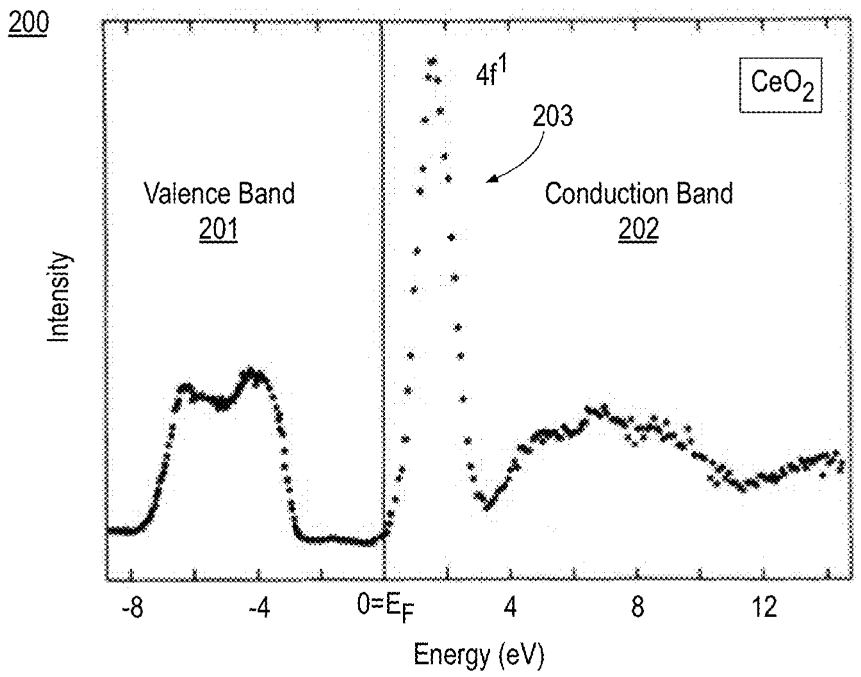
FIG. 2 illustrates a plot showing band states in cerium oxide.

FIG. 2 illustrates a plot 200 showing band states in cerium oxide, arranged in accordance with at least some implementations of the present disclosure. For example, plot 200 illustrates intensity (in arbitrary unites) versus energy (in electron volts, eV) for cerium oxide ($CeO_2$). As shown in FIG. 2, between valence band 201 and conduction band 202, cerium oxide exhibits a mid gap state 203. Mid gap state 203 is large and evidences that cerium oxide has a large number of states that may accept electrons (e.g., that would otherwise damage the host HZO). Therefore, deployment of cerium oxide in the AFE super-lattice of AFE capacitor 100 provides a material that can withstand the damage that would otherwise be done to the host HZO material.

Figure 3A:
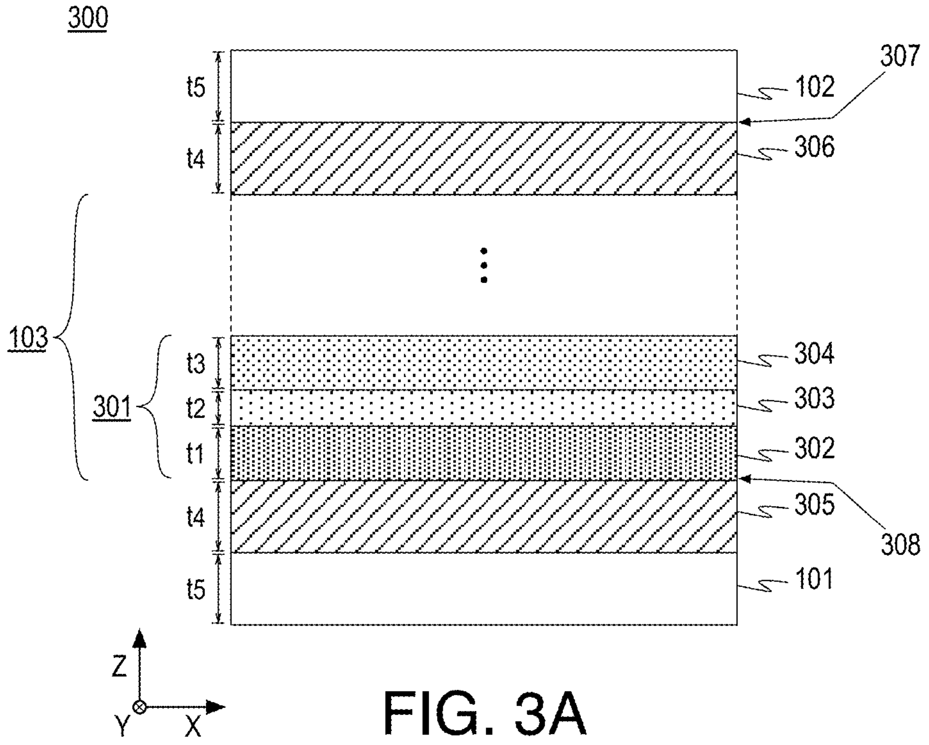
FIG. 3A illustrates a cross-sectional side view of an example anti-ferroelectric capacitor structure having a cerium doped anti-ferroelectric.

FIG. 3A illustrates a cross-sectional side view of an example anti-ferroelectric capacitor structure 300 having a cerium doped anti-ferroelectric, arranged in accordance with at least some implementations of the present disclosure. As shown in FIG. 3A, anti-ferroelectric (AFE) capacitor structure 300 includes bottom electrode 101 and top electrode 102. Between electrodes 101 is AFE material stack 103. AFE capacitor structure 300 further includes an interfacial layer 305 on bottom electrode 101 and an interfacial layer 306 on top electrode 102 such that AFE material stack 103 is also between interfacial layers 305, 306. AFE capacitor structure 300 may be deployed in any capacitor architecture as discussed further herein below.

AFE, material stack 103 includes any number of multi-layer stacks 301. Each of multi-layer stacks 301 includes a hafnium oxide layer 302, a cerium oxide layer 303, and a zirconium oxide layer 304. Although illustrated with cerium oxide layer 303 directly on hafnium oxide layer 302, and zirconium oxide layer 304 directly on cerium oxide layer 303, layers 302, 303, 304 may be provided in any order. In some embodiments, hafnium oxide layer 302 is directly on cerium oxide layer 303, and zirconium oxide layer 304 is directly on hafnium oxide layer 302. In some embodiments, zirconium oxide layer 304 is directly on hafnium oxide layer 302, and cerium oxide layer 303 is directly on zirconium oxide layer 304. Furthermore, intervening layers may be provided between layers 302, 303, 304.

In any such configuration, the gap states of cerium oxide layer 303 protect the hafnium zirconium oxide(s) of hafnium oxide layer 302 and zirconium oxide layer 304. As discussed with respect to FIG. 2, mid gap states 203 receive electrons during operation to prevent additional Joule heating to the hafnium zirconium oxide. Therefore, the breakdown in dielectric is significantly reduced.

As shown, AFE capacitor structure 300 includes bottom electrode 101. Bottom electrode 101 may include any suitable conductive material such as a metal. In some embodiments, bottom electrode 101 includes one or more of titanium nitride (TiN, e.g., titanium and nitrogen), tungsten (W), tantalum nitride (TaN, e.g., tantalum and nitrogen), ruthenium (Ru), iridium (Ir), aluminum (Al), copper (Cu), titanium (Ti), cobalt (Co), chromium (Cr), molybdenum (Mo), nickel (Ni), gold (Au), or platinum (Pt). Similarly, top electrode 102 may include any suitable conductive material such as a metal. In some embodiments, top electrode 102 includes one or more of titanium nitride (TiN, e.g., titanium and nitrogen), tungsten (W), tantalum nitride (TaN, e.g., tantalum and nitrogen), ruthenium (Ru), iridium (Ir), aluminum (Al), copper (Cu), titanium (Ti), cobalt (Co), chromium (Cr), molybdenum (Mo), nickel (Ni), gold (Au), or platinum (Pt). Bottom electrode 101 and top electrode 102 may have any suitable thickness t5 such as a thickness in the range of 5 nm to 30 nm. The thicknesses of bottom electrode 101 and top electrode may be the same or they may be different. Furthermore, the material(s) deployed in bottom electrode 101 and top electrode 102 may be the same or they may be different. In some embodiments, bottom electrode 101 and top electrode 102 advantageously deploy different materials or material systems to introduce built-in fields in AFE material stack 103 to provide desirable operation voltage ranges as discussed with respect to FIG. 1E. For example, the materials of bottom electrode 101 and top electrode 102 may be selected to shift the double hysteresis loop of the material system of AFE material stack 103. In some embodiments, one or both of bottom electrode 101 and top electrode 102 include a multi-layer material stack including titanium nitride adjacent AFE material stack 103, as discussed herein below.

Interfacial layer 305 is on electrode 101 and interfacial layer 306 is on electrode 102. Interfacial layer 305 aids in the transition from the material microstructure of electrodes 101, 102 to that of AFE material stack 103. In some embodiments, interfacial layer 305 is one of ruthenium oxide ($RuO_x$), iridium oxide ($IrO_x$), aluminum oxide ($Al_xO_y$), titanium oxide ($TiO_x$), indium gallium zinc oxide (IGZO), indium oxide ($In_xO_y$), tantalum oxide ($Ta_xO_y$), lanthanum oxide ($La_xO_y$), niobium oxide ($NbO_x$), tungsten oxide ($WO_x$), or sodium oxide ($Na_xO_y$). Similarly, interfacial layer 306 may be one of ruthenium oxide ($RuO_x$), iridium oxide ($IrO_x$), aluminum oxide ($Al_xO_y$), titanium oxide ($TiO_x$), indium gallium zinc oxide (IGZO), indium oxide ($In_xO_y$), tantalum oxide ($Ta_xO_y$), lanthanum oxide ($La_xO_y$), niobium oxide ($NbO_x$), tungsten oxide ($WO_x$), or sodium oxide ($Na_2O_3$) Interfacial layer 305 and interfacial layer 306 may have any suitable thickness t4 such as a thickness of not more than 5 nm. The thicknesses of interfacial layer 305 and interfacial layer 306 may be the same or they may be different. Furthermore, the material(s) deployed in interfacial layer 305 and interfacial layer 306 may be the same or they may be different. In some embodiments, interfacial layer 305 and interfacial layer 306 advantageously deploy different materials or material systems to introduce built-in fields in AFE material stack 103 to provide desirable operation voltage ranges as discussed with respect to FIG. 1E.

As shown with respect to termination surfaces 307, 308, in some embodiments, interfacial layer 305 interfaces with a hafnium oxide layer 302 of AFE material stack 103 and interfacial layer 306 interfaces with a zirconium oxide layer 304 of AFE material stack 103. However, interfacial layers 305, 306 may interface with any of a hafnium oxide layer 302, a cerium oxide layer 303, or a zirconium oxide layer 304. For example, terminal ones of multi-layer stacks 301 may have fewer than three layers such that the periodic nature of multi-layer stacks 301 is maintained within a bulk of AFE material stack 103 but is not necessarily maintained at the terminal ones of multi-layer stacks 301.

As shown, AFE capacitor structure 300 includes electrode 101, which is a metal, metal alloy, or stack of layers including metal. AFE capacitor structure 300 further includes electrode 102, which is a metal, metal alloy, or stack of layers including metal. Electrodes 101, 102 may be the same material or materials or they may be different. For example, electrodes 101, 102 may each be a same first metal or electrode 101 may be a first metal and electrode 102 may be a second, different metal. AFE capacitor structure 300 includes AFE material stack 103 between electrodes 101, 102. AFE material stack 103 includes at least one layer each of hafnium oxide layer 302, a cerium oxide layer 303, or a zirconium oxide layer 304. For example, AFE material stack 103 includes layer 302 including hafnium and oxygen, layer 303 including cerium and oxygen, and layer 304 including zirconium and oxygen.

In some embodiments, AFE material stack 103 includes a single multi-layer stack 301 of hafnium oxide layer 302, a cerium oxide layer 303, or a zirconium oxide layer 304. In some embodiments, AFE material stack 103 includes two or more multi-layer stacks 301 of hafnium oxide layer 302, a cerium oxide layer 303, or a zirconium oxide layer 304. For example, AFE material stack 103 may include two, three, four, or more multi-layer stacks 301 of hafnium oxide layer 302, a cerium oxide layer 303, or a zirconium oxide layer 304. Other numbers of multi-layer stacks 301 may be used.

As shown, hafnium oxide layer 302 has a thickness t1, cerium oxide layer 303 has a thickness t2, and zirconium oxide layer 304 has a thickness t3. In some embodiments, AFE capacitor structure 300 has AFE characteristics due to the concentration of zirconium in AFE material stack 103 and/or the ratio of zirconium to hafnium in AFE material stack 103. In some embodiments, the thicknesses of hafnium oxide layer 302, cerium oxide layer 303, and zirconium oxide layer 304 are determined as follows. In some embodiments, the thickness t2 of cerium oxide layer 303 is constrained to be not more than 15% of the sum of thickness t1 of hafnium oxide layer 302 and the thickness t3 of zirconium oxide layer 304 (i.e., $t2 \leq 0.15*(t1+t3)$).

Furthermore, to have AFE characteristics, the concentration of zirconium must be greater than that of hafnium. For example, at low zirconium to hafnium ratio levels, HZO exhibits dielectric properties. At greater zirconium to hafnium ratios but still not greater than 1:1, HZO exhibits ferroelectric properties. At zirconium to hafnium ratios of greater than 1:1, HZO exhibits AFE properties. Such concentrations, in AFE material stack 103 are controlled using thickness t1, t2, t3. In some embodiments, the thickness t3 of zirconium oxide layer 304 is greater than the thickness t1 of hafnium oxide layer 302 to provide such AFE material characteristics.

Therefore, using the thickness t2 of cerium oxide layer 303 as the baseline, the thicknesses t1, t3 of hafnium oxide layer 302 and zirconium oxide layer 304 may then be determined such that the sum of the thicknesses t1, t3 of hafnium oxide layer 302 and zirconium oxide layer 304 is the thickness t2 of cerium oxide layer 303 divided by a value of not more than 15% (i.e., $t1+t3=t2/a$, $a \leq 15\%$). The thickness t3 of zirconium oxide layer 304 is then set to a value greater than that of the thickness t1 of hafnium oxide layer 302. Thickness t3 may be greater than thickness by any suitable amount such as 5% to 50% or more (i.e., $t3>t1$).

In some embodiments, the thickness t2 of cerium oxide layer 303 is not more than 0.5 nm. In some embodiments, the thickness t2 of cerium oxide layer 303 is about 0.5 nm. For example, cerium oxide layer 303 may be a monolayer of material. Using a thickness t2 of cerium oxide layer 303 being 15% of the sum of thickness t1 of hafnium oxide layer 302 and the thickness t3 of zirconium oxide layer 304, the sum may then be about 3 nm to 3.5 nm. In some embodiments, the sum of the thicknesses t1, t3 of hafnium oxide layer 302 and zirconium oxide layer 304 is in the range of 3 nm to 4 nm, in the range of 4 nm to 6 nm, or in the range of 5 nm to 10 nm. The thicknesses t1, t3 of hafnium oxide layer 302 and zirconium oxide layer 304 are then implemented such that the thickness t3 of zirconium oxide layer 304 is greater than that of the thickness t1 of hafnium oxide layer 302. In some embodiments, the thickness t1 of hafnium oxide layer 302 is about 1.5 nm and the thickness t3 is about 2 nm. In some embodiments, the thickness t1 of hafnium oxide layer 302 is about 2 nm and the thickness t3 is about 2.5 to 3 nm. In some embodiments, the thickness t1 of hafnium oxide layer 302 is about 3 nm and the thickness t3 is about 3.5 to 5 nm. In some embodiments, the thickness t1 of hafnium oxide layer 302 is about 5 nm and the thickness t3 is about 6 to 8 nm. Other thicknesses may be used.

As discussed, the introduction of cerium oxide layers 303 in AFE material stack 103 provides for a sink for damage during operation of AFE capacitor 100. The cerium in cerium oxide layers 303 introduces additional gap states to reduce damage from Joule heating to the host HZO layers or films. As discussed, the mid gap states from cerium are close to the Fermi level of titanium nitride (TiN) and, in some embodiments, electrode 101, electrode 102, or both have a layer of titanium nitride adjacent to the cerium oxide doped super-lattice AFE material such that efficient electron injections from the titanium nitride to the cerium protect the host hafnium oxide and zirconium oxide layers.

Figure 3B:
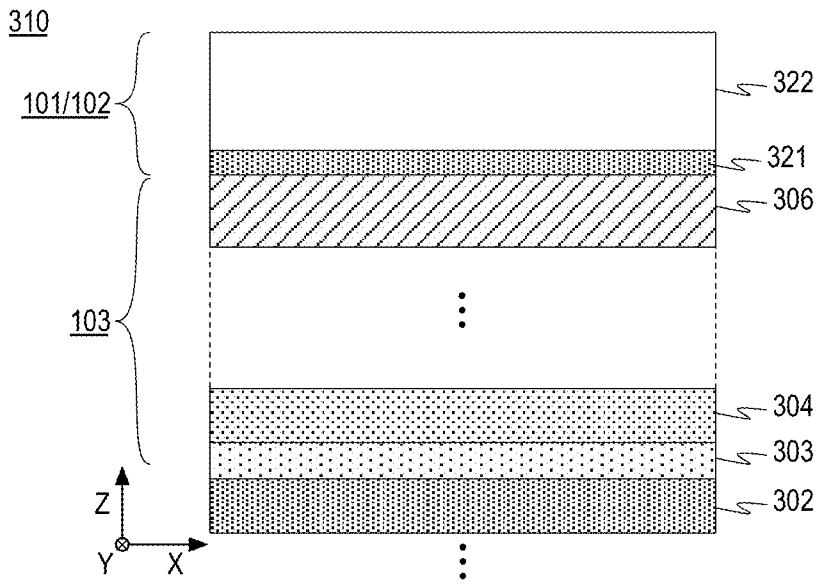
FIG. 3B illustrates a cross-sectional side view of an example cerium doped anti-ferroelectric capacitor structure having a multi-layer electrode.

FIG. 3B illustrates a cross-sectional side view of an example cerium doped anti-ferroelectric capacitor structure 310 having a multi-layer electrode, arranged in accordance with at least some implementations of the present disclosure. As shown in FIG. 3B, anti-ferroelectric (AFE) capacitor structure 310 has a structure similar to that of AFE capacitor structure 300 with the exception that one or both of electrodes 101, 102 have a first layer 321 and a second layer 322. In FIG. 3B, and elsewhere herein, like numerals indicate like components having the same or similar features.

Notably, one or both of electrodes 101, 102 has first layer 321 adjacent AFE material stack 103 and second layer 322 opposite first layer 321 with respect to AFE material stack 103. In some embodiments, first layer 321 is a material used to match the mid gap states of the cerium of cerium oxide layer 303 to a Fermi level of the material of first layer 321. In some embodiments, first layer 321 is titanium nitride (TiN) such that first layer 321 includes titanium and nitrogen. As discussed, the Fermi level of titanium nitride is close to the mid gap states of cerium, making the absorption of electrons that would otherwise damage the host HZO material more efficient. Although discussed with respect to titanium nitride, other materials may be used. first layer 321 may have any suitable thickness such as a thickness of not more than 5 nm. In some embodiments, first layer 321 has a thickness of not more than 2 nm. In some embodiments, first layer 321 is a monolayer.

Second layer 322 may then make up the remainder of thickness t5 of one or both of electrodes 101, 102 (refer to FIG. 3A), and second layer 322 may be any material discussed with respect to electrodes 101, 102 such as tungsten, tantalum, ruthenium, iridium, aluminum, copper, titanium, cobalt, chromium, molybdenum, nickel, gold, or platinum. For example, first layer 301 may be a Fermi level tuning layer and second layer 322 may be a bulk conductor layer. As discussed, one or both of electrodes 101, 102 may deploy first layer 321 and second layer 322. Also as discussed, the materials of electrodes 101, 102 may be selected to introduce built-in fields in AFE material stack 103. In some embodiments, both of electrodes 101, 102 deploy a first layer 321 of titanium nitride and a bulk second layer 322 with first electrode 101 having a first bulk metal (i.e., one of tungsten, tantalum, ruthenium, iridium, aluminum, copper, titanium, cobalt, chromium, molybdenum, nickel, gold, and platinum) or a first bulk metal system and second electrode having a second bulk metal (i.e., another of tungsten, tantalum, ruthenium, iridium, aluminum, copper, titanium, cobalt, chromium, molybdenum, nickel, gold, or platinum) or a second bulk metal system.

Figure 3C:
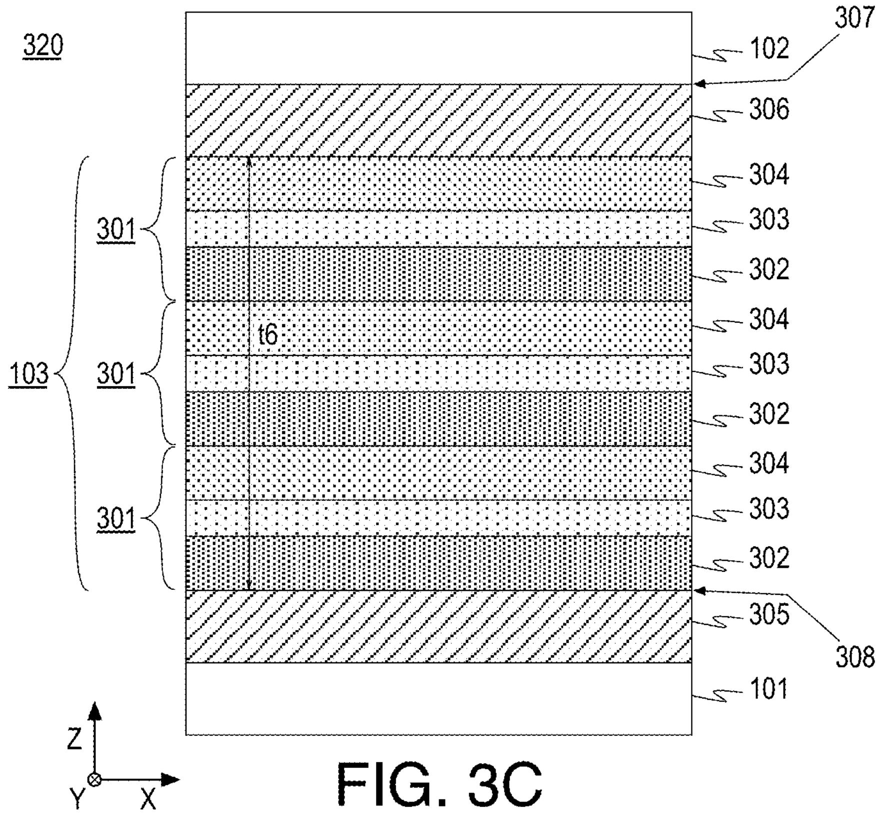
FIG. 3C illustrates a cross-sectional side view of an example cerium doped anti-ferroelectric capacitor structure having three multi-layer stacks in the anti-ferroelectric.

FIG. 3C illustrates a cross-sectional side view of an example cerium doped anti-ferroelectric capacitor structure 320 having three multi-layer stacks in the anti-ferroelectric, arranged in accordance with at least some implementations of the present disclosure. As shown in FIG. 3C, anti-ferroelectric (AFE) capacitor structure 320 has a structure similar to that of AFE capacitor structure 300, and deploys three multi-layer stacks 301 in AFE material stack 103. In the illustrated embodiment, each of multi-layer stacks 301 has a bottom hafnium oxide layer 302, a cerium oxide layer 303 on the hafnium oxide layer 302, and a zirconium oxide layer 304 on the cerium oxide layer 303. However, as discussed, such layers may be provided in any order. Furthermore, AFE capacitor structure 320 has hafnium oxide layer 302 on interfacial layer 305 and a zirconium oxide layer 304 on interfacial layer 306. However, any of layers 302, 303, 304 may terminate on interfacial layer 305, 306.

In the example of AFE capacitor structure 320, three multi-layer stacks 301 are deployed in AFE material stack 103. However, any number of multi-layer stacks 301 may be used, such as one, two, four, or more. The overall thickness t6 of AFE, material stack 103 may be in the range of about 6 nm to 100 nm, for example. In some embodiments, thickness t6 of AFE material stack 103 is in the range of 6 nm to 30 nm. In some embodiments, thickness t6 of AFE material stack 103 is in the range of 20 nm to 50 nm. In some embodiments, thickness t6 of AFE material stack 103 is in the range of 40 nm to 100 nm. Other thicknesses may be used.

As discussed, AFE capacitor structures 300, 310, 320 may be deployed in any suitable capacitor and/or memory architecture such as deep trench capacitors, multiple capacitor arrays, planar capacitors, or others.

Figure 4:
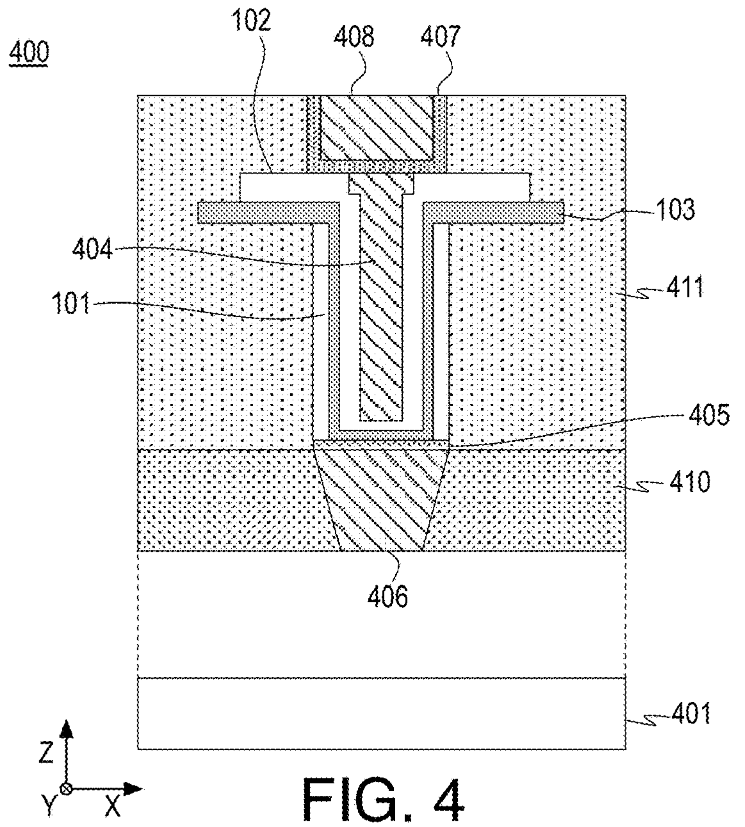
FIG. 4 illustrates a cross-sectional side view of an exemplary deep trench capacitor having a cerium doped anti-ferroelectric.

FIG. 4 illustrates a cross-sectional side view of an exemplary deep trench capacitor 400 having a cerium doped anti-ferroelectric, arranged in accordance with some embodiments of the disclosure. In the example of FIG. 4, deep trench capacitor 400 may be deployed over a bit line (i.e., capacitor over bit line, COB). Deep trench capacitor 400 may have a U-shape (as shown) or a V-shape. As shown, deep trench capacitor 400 includes electrode 101 (e.g., 101), electrode 102, AFE material stack 103 (illustrated as a single component for the sake of clarity, metal via 404, barrier layer 405, interconnect 406, barrier layer 407, and interconnect 408. Electrode 101 is coupled to interconnect 406 via barrier layer 405 and electrode 102 is coupled to interconnect 408 via metal via 404 and barrier layer 407. Deep trench capacitor 400 is formed in insulator 411 (e.g., SiO2), interconnect 406 is embedded in insulator 410, and such components are formed over substrate 401.

In some embodiments, the substrate 401 is a material used to manufacture integrated circuits inclusive of semiconductor materials such as, but not limited to, single crystal silicon, polycrystalline silicon and silicon on insulator (SOI). In some embodiments, substrate 401 includes other semiconductor materials such as germanium, silicon germanium, or a suitable group III-V or group III-N compound. Substrate 401 may also include semiconductor materials, metals, dopants, and other materials commonly found in semiconductor substrates. In some embodiments, substrate 401 includes a device layer (e.g., transistor devices), metallization stack(s), or other device layers. In COB configurations, capacitors are fabricated above an access transistor in the back-end interconnect portion of the process flow.

Figure 5:
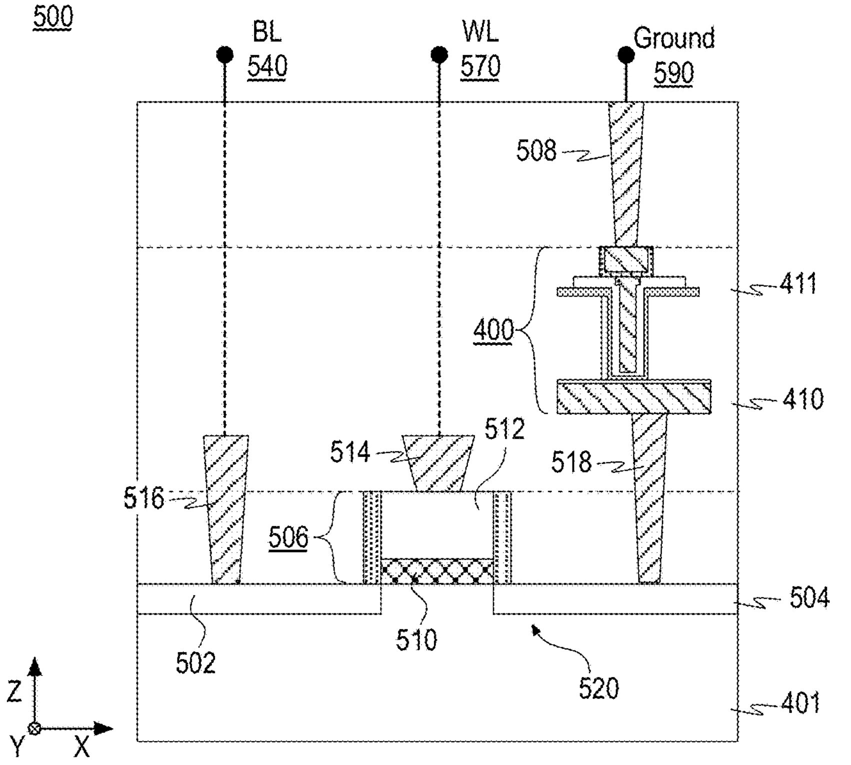
FIG. 5 illustrates a cross-section of an embedded dynamic random access memory including capacitor having a cerium doped anti-ferroelectric.

FIG. 5 illustrates a cross-section of an embedded dynamic random access memory 500 including capacitor 400 having a cerium doped anti-ferroelectric, arranged in accordance with some embodiments of the disclosure. Although illustrated with respect to deep trench capacitor 400 being deployed in embedded dynamic random access memory 500, any capacitor structure discussed herein may be used. As shown, embedded dynamic random access memory 500 includes a select transistor 520 coupled to a capacitor such as deep trench capacitor 400. Transistor 520 includes a source region 502, a drain region 504, and a gate 506. Transistor 520 further includes a gate contact 514 on and electrically coupled to gate 506, a source contact 516 on and electrically coupled to source region 502, and a drain contact 518 on and electrically coupled to drain region 504. In some embodiments, capacitor 400 is above transistor 520 such that electrode 101 is coupled to drain contact 518 and electrode 102 is coupled to a via 508.

In some embodiments, transistor 520 is a metal-oxide-semiconductor field-effect transistor (MOSFET or simply MOS transistors). Transistor 520 may be a planar transistor (as shown) or a nonplanar transistor such as a FinFET or a gate all around transistor such as a nanoribbon or nanowire transistor. Data is written into capacitor 400 as charge via a bit line (BL) 540 when access transistor 520 is turned on by applying a voltage on a word line WL 570. Interconnect 408 couples to a ground 590 through a metal via 508. In some embodiments, gate 506 is formed of at least two layers, gate dielectric layer 510 and gate electrode layer 512. Gate dielectric layer 510 may include one layer or a stack of layers including one or more of silicon dioxide and/or a high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Gate electrode layer 512 is on gate dielectric layer 510 and may comprise of at least one a P-type work-function metal (e.g., ruthenium, palladium, platinum, cobalt, nickel, and conductive metal oxides, e.g., ruthenium oxide) or a N-type work-function metal (e.g., hafnium, zirconium, titanium, tantalum, aluminum, alloys of these metals, and carbides of these metals such as hafnium carbide, zirconium carbide, titanium carbide, tantalum carbide, and aluminum carbide), depending on whether the transistor is to be a PMOS or an NMOS transistor. In some embodiments, the gate electrode layer 512 may comprise of a stack of two or more metal layers, where one or more metal layers are work-function metal layers and at least one metal layer is a conductive fill layer.

Figure 6:
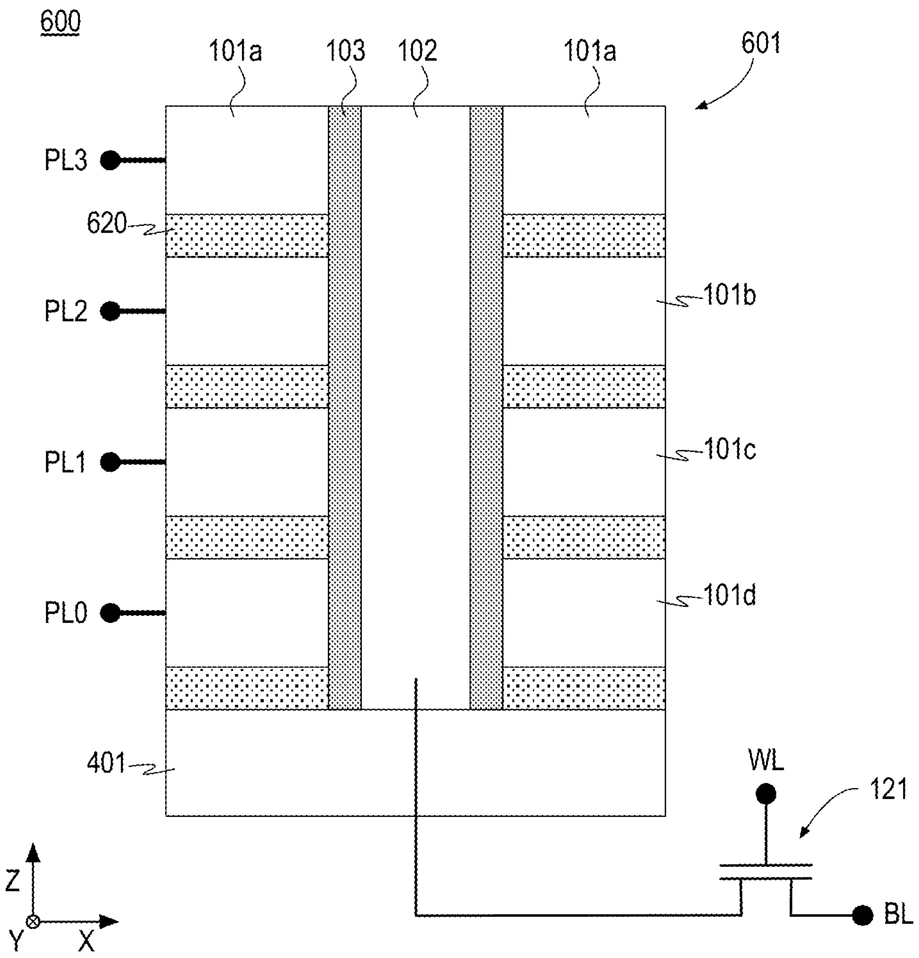
FIG. 6 illustrates a cross-sectional side view of a multiple capacitor stacked memory device including capacitors having a cerium doped anti-ferroelectric.

FIG. 6 illustrates a cross-sectional side view of a multiple capacitor stacked memory device 600 including capacitors having a cerium doped anti-ferroelectric, arranged in accordance with some embodiments of the disclosure. As shown in FIG. 6, memory device 600 includes multiple AFE capacitors 601 outer electrodes 101*a-d*, AFE material stack 103, and a shared electrode 102. Memory device 600 includes a vertically aligned array of AFE capacitors 601 such that each AFE capacitor 601 includes a electrode 101*a-d*, and a portion of electrode 102, which extends vertically through AFE capacitors 601, electrodes 101*a-d*, and AFE material stack 103. Electrode 102 electrically connects to select transistor 121, as discussed herein. Insulators 620 surround electrode 102 and vertically separate and electrically isolate electrodes 101*a-d.*

Electrodes 101*a-d* may each be part of an integrated structure coupled to a corresponding plate line. For example, AFE material stack 103 may be on an inner surface of a corresponding plate line, which is integral with corresponding electrodes 101*a-d*. In the example of FIG. 1, AFE material stack 103 is on an inner surface of plate lines PL0, PL1, PL2, PL3, which are each integral with a corresponding electrodes 101*a-d.*

Transistor 121 controls access to the memory array by electrically connecting (or not) electrode 102 to a bit line BL connected at a drain contact of transistor 121. When transistor 121 conducts, electrode 102 on electrically connected to bit line BL. The conduction of transistor 121 is controlled by the voltage signal applied to a gate electrode by a word line WL. Since electrode 102 is shared for all AFE capacitors 601 in the group, any bit stored in any of AFE, capacitors 601 is accessible by single transistor 121. With transistor 121 accessing the entire memory array of AFE capacitors 601, individual control of AFE capacitors 601 is by electrodes 101*a-d* using plate lines PL0-PL3 in concert with transistor 121.

Figure 7:
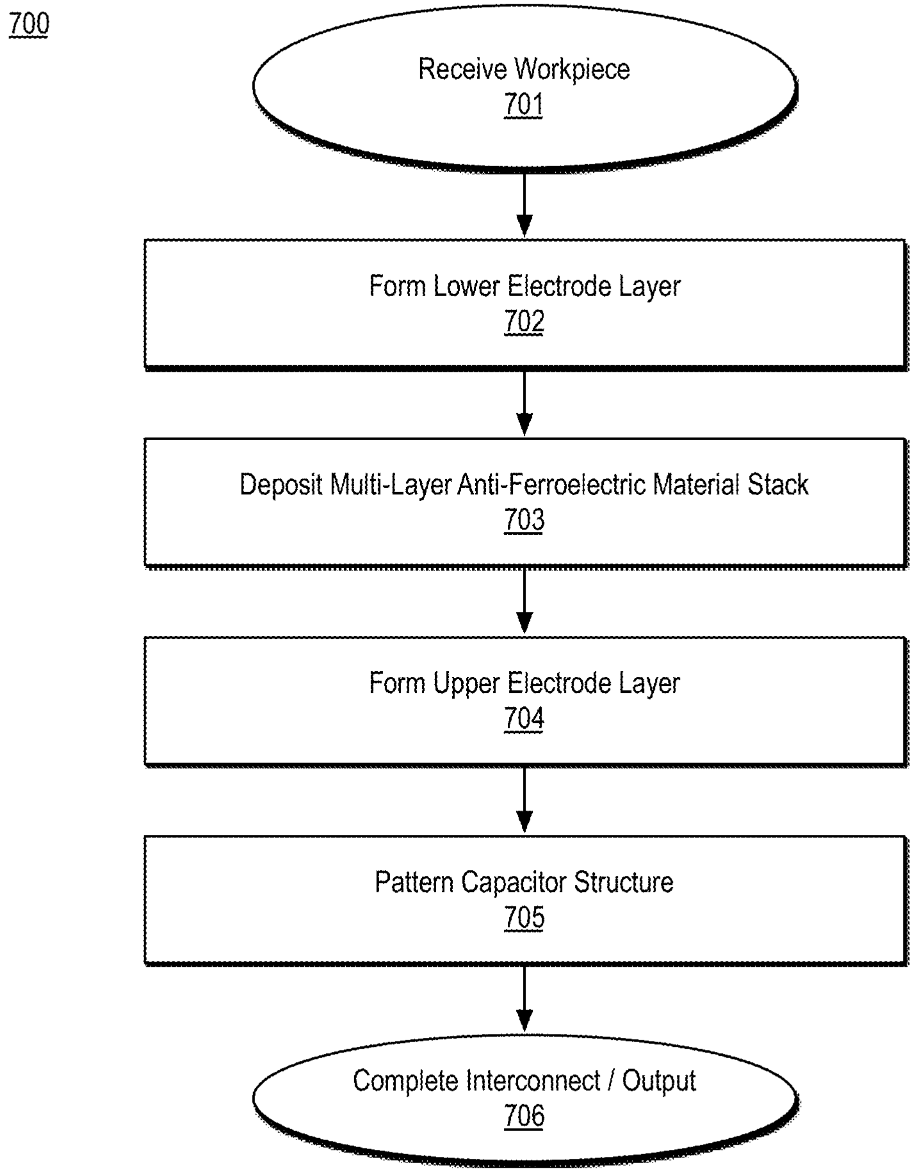
FIG. 7 is a flow diagram illustrating methods for forming a capacitor including a cerium doped anti-ferroelectric carbon electrode layer.

FIG. 7 is a flow diagram illustrating methods 700 for forming a capacitor including a cerium doped anti-ferroelectric carbon electrode layer, arranged in accordance with some embodiments of the disclosure. Methods 700 may be practiced, for example, to fabricate any of AFE, capacitor 100, capacitor structures 300, 310, 320, deep trench capacitor 400, or AFE capacitors 601, or a thin film capacitor 840. FIGS. 8A, 8B, 8C, and 8D are cross-sectional views of a capacitor structure evolving as methods 700 are practiced, arranged in accordance with some embodiments of the disclosure.

Methods 700 begin at input operation 701 where a workpiece including one or more material layers of a monolithic IC is received. In some embodiments, the workpiece is a large format (e.g., 300-450 mm) wafer and includes at least a capacitor electrode material layer on a working surface of the wafer. Processing continues at operation 702, where a lower electrode layer is formed using any suitable technique or techniques such as blanket deposition techniques. In the example illustrated in FIG. 8A, capacitor structure 810 includes interconnect 406 over substrate 401, with interconnect 406 on barrier layer 405. Interconnect 406 and barrier layer 405 are embedded within insulator 410. Insulator 410 may be silicon dioxide, silicon nitride, silicon carbide, or a low-k dielectric such as carbon doped silicon oxide. Barrier layer 405 may include tantalum, tantalum nitride, or ruthenium, for example. Interconnect 406 includes a fill metal that may be cobalt, copper, tungsten, or ruthenium for example.

Figure 8A:
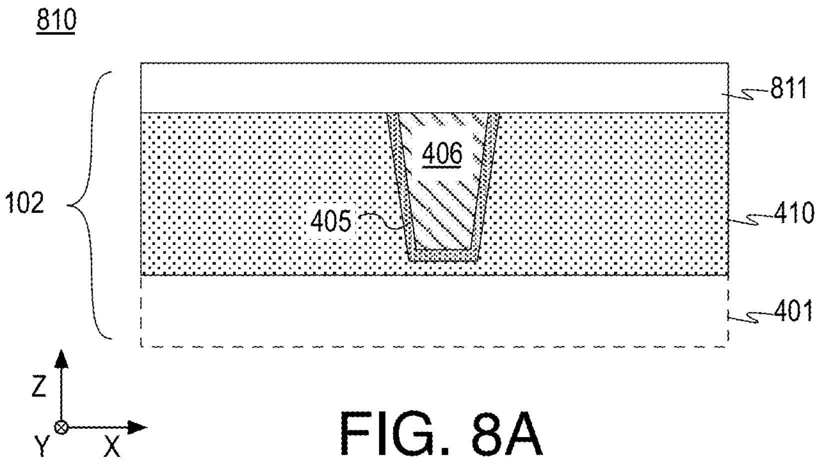
FIGS. 8A, 8B, 8C, and 8D are cross-sectional views of a capacitor structure evolving as the methods of FIG. 7 are practiced.

As shown in FIG. 8A, capacitor structure 810 also includes a lower electrode material layer 811 (as formed at operation 702), which is to become electrode 101 of thin film capacitor 840. Electrode material layer 811 may include any material, materials, or material stack as discussed herein with respect to electrodes 101, 102. Electrode material layer 811 may be formed using any suitable technique or techniques such as blanket deposition. The blanket deposition may be performed with a physical vapor deposition (PVD) process, for example.

Returning to FIG. 7, methods 700 continue at operation 703, where a multi-layer AFE material stack is blanket deposited in direct contact with the lower electrode material layer. Any deposition technique or techniques known to be suitable for deposition of the materials of multi-layer AFE material stack may be practiced at operation 703, but in some exemplary embodiments, one or more layers of the multi-layer AFE material stack are deposited with a PVD process or a plasma enhanced chemical vapor deposition (PECVD). The PVD process may be performed with the workpiece at an elevated temperature, for example, at a temperature of 350-400° C., or more, which may promote a particular crystal texture and/or dominant phase within the material.

Processing continues at operation 704, where an upper electrode material layer is blanket deposited in direct contact with the multi-layer AFE material stack. Although any deposition technique or techniques known to be suitable for such deposition may be practiced at operation 704, in some exemplary embodiments, the upper electrode material layer is deposited with a PVD process.

Figure 8B:
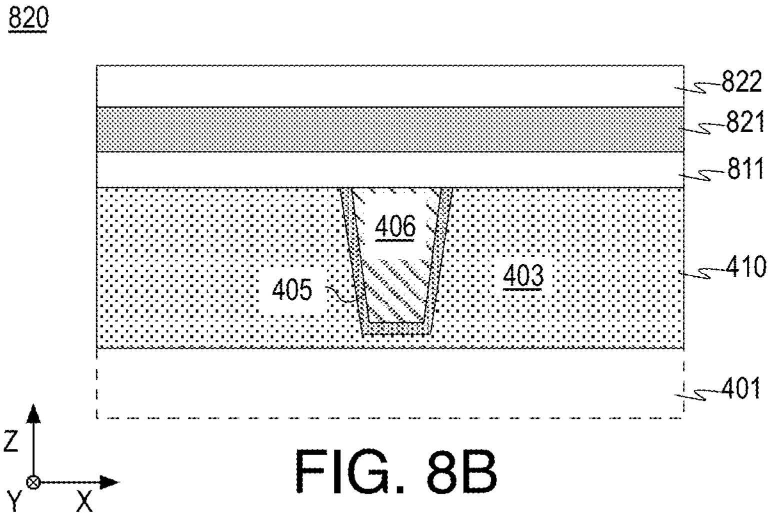

FIG. 8B illustrates an example capacitor structure 820 similar to capacitor structure 810 after blanket deposition of a multi-layer AFE material stack 821 followed by blanket deposition of an electrode material layer 822. Multi-layer AFE material stack 821 is to become AFE material stack 103 of thin film capacitor 840 may include any materials and characteristics discussed with respect to AFE material stack 103 herein. Similarly, electrode material layer 822 is to become electrode 102 of thin film capacitor 840. Electrode material layer 822 may include any material, materials, or material stack as discussed herein with respect to electrodes 101, 102.

Returning to FIG. 7, methods 700 continue at operation 705, where the capacitor material layers are patterned with any subtractive process(es) suitable for various material layer compositions. Following capacitor patterning, any remaining interconnect levels of the IC may be completed and the resultant structure maybe output at operation 706. For example, the upper electrode of the capacitor may be connected to other circuit nodes with an upper-level metallization.

Figure 8C:
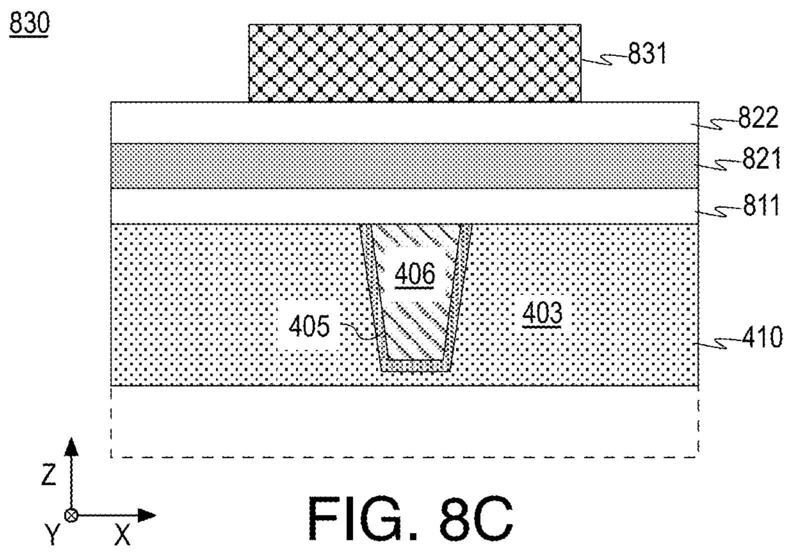
Figure 8D:
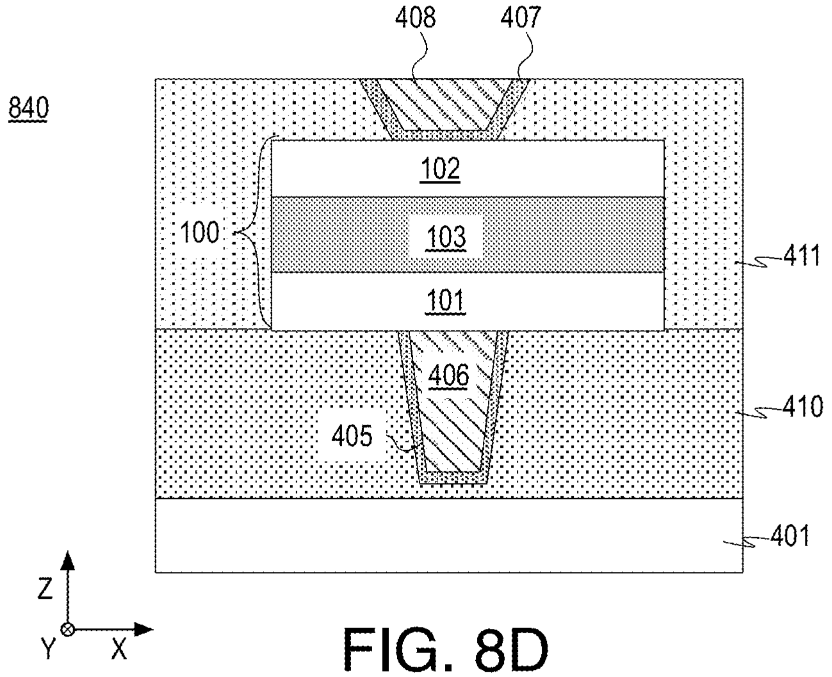

FIG. 8C illustrates an example capacitor structure 830 similar to capacitor structure 820 after patterning a mask 831 on electrode material layer 822. Mask 831 defines a polygon area and position of thin film capacitor 840, for example, relative to interconnect 406. Mask 831 may be formed with any lithographic process(es) as embodiments are not limited in this respect. FIG. 8D illustrates thin film capacitor 840 similar to capacitor structure 830 after the patterning of the capacitor material layer stack. In some embodiments, the capacitor material layer stack may be patterned with one or more plasma etch processes. The plasma etch process defines sidewalls into the various material layers 811, 821, 822 to form electrode layer 101, AFE material stack 103, and electrode 102, respectively. FIG. 8D further illustrates an example where an upper-level interconnect 408 and barrier layer 407 has been fabricated in contact with electrode 102. Barrier layer 407 may provide for improved adhesion layer and may include, for example, tantalum, tantalum nitride, or ruthenium) in contact with electrode 102. Interconnect may include any suitable fill metal such as cobalt, tungsten, or copper.

Although illustrated with respect to thin film capacitor 840, methods 700 may be extended for use to fabricate other capacitor architectures such as deep trench capacitor 400, multiple capacitor stacked memory device 600, or others.

Figure 9:
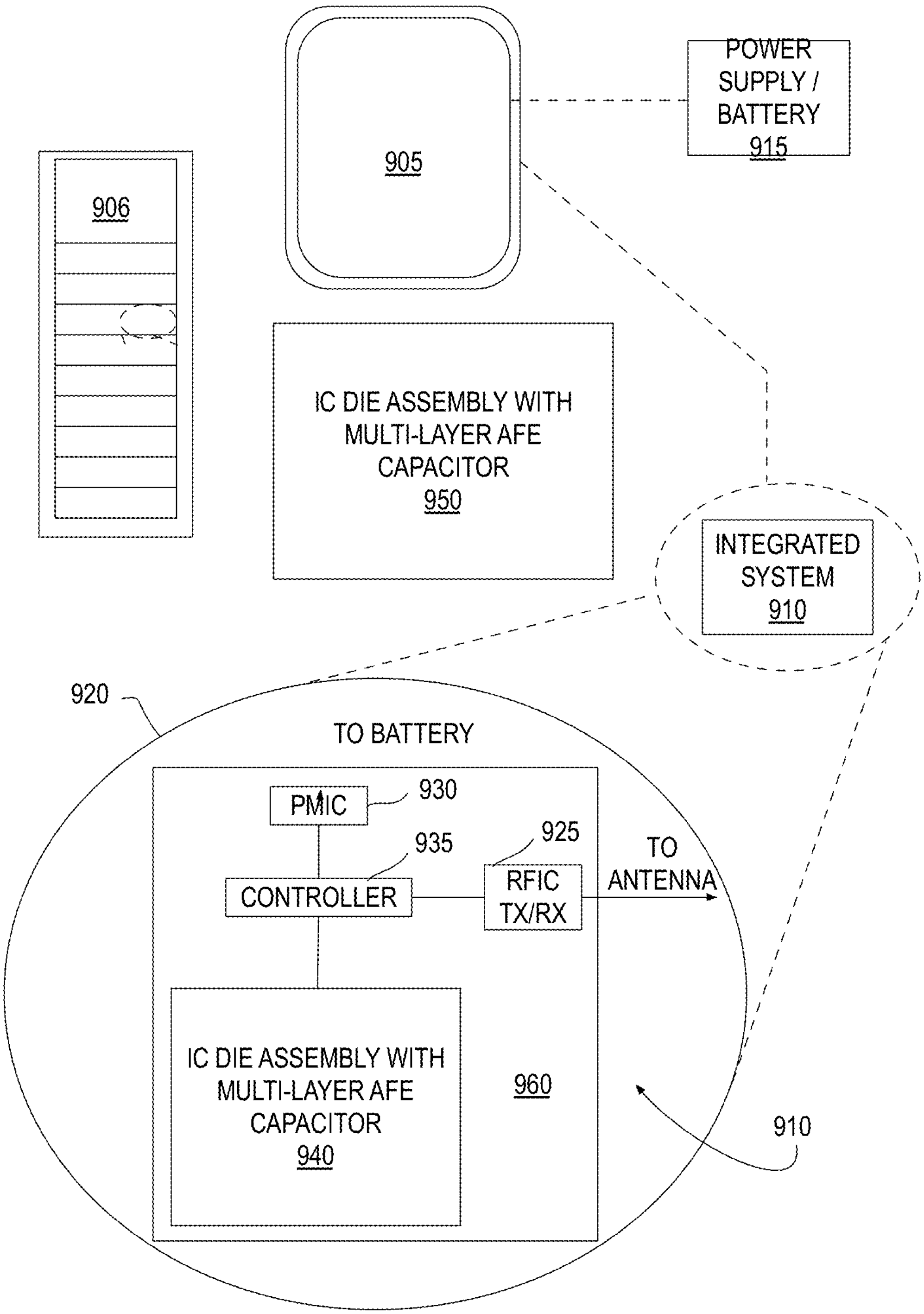
FIG. 9 illustrates exemplary systems employing an IC die including a memory having a cerium doped anti-ferroelectric capacitor.

FIG. 9 illustrates exemplary systems employing an IC die including a memory having a cerium doped anti-ferroelectric capacitor, in accordance with some embodiments. The system may be a mobile computing platform 905 and/or a data server machine 906, for example. Either may employ a memory cell, capacitor, or the like having an AFE material stack as described elsewhere herein. Server machine 906 may be any commercial server, for example including any number of high-performance computing platforms disposed within a rack and networked together for electronic data processing, which in the exemplary embodiment includes an IC die assembly 950 with an IC die assembly including a multi-layer AFE, capacitor as described elsewhere herein. Mobile computing platform 905 may be any portable device configured for each of electronic data display, electronic data processing, wireless electronic data transmission, or the like. For example, mobile computing platform 905 may be any of a tablet, a smart phone, a laptop computer, etc., and may include a display screen (e.g., a capacitive, inductive, resistive, or optical touchscreen), a chip-level or package-level integrated system 910, and a battery 915. Although illustrated with respect to mobile computing platform 905, in other examples, chip-level or package-level integrated system 910 and a power supply/battery 915 may be implemented in a desktop computing platform, an automotive computing platform, an internet of things platform, or the like. As discussed below, in some examples, the disclosed systems may include a sub-system 960 such as a system on a chip (SOC) or an integrated system of multiple ICs, which is illustrated with respect to mobile computing platform 905.

Whether disposed within integrated system 910 illustrated in expanded view 920 or as a stand-alone packaged device within data server machine 906, sub-system 960 may include memory circuitry and/or processor circuitry 940 (e.g., RAM, a microprocessor, a multi-core microprocessor, graphics processor, etc.), a power management integrated circuit (PMIC) 930, a controller 935, and a radio frequency integrated circuit (RFIC) 925 (e.g., including a wideband RF transmitter and/or receiver (TX/RX)). As shown, one or more IC dice, such as memory circuitry and/or processor circuitry 940 may be assembled and implemented such that one or more have a multi-layer AFE capacitor as described herein. In some embodiments, RFIC 925 includes a digital baseband and an analog front end module further comprising a power amplifier on a transmit path and a low noise amplifier on a receive path). Functionally, PMIC 930 may perform battery power regulation, DC-to-DC conversion, etc., and so has an input coupled to power supply/battery 915, and an output providing a current supply to other functional modules. As further illustrated in FIG. 9, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Memory circuitry and/or processor circuitry 940 may provide memory functionality for sub-system 960, high level control, data processing and the like for sub-system 960. In alternative implementations, each of the SOC modules may be integrated onto separate ICs coupled to a package substrate, interposer, or board.

Figure 10:
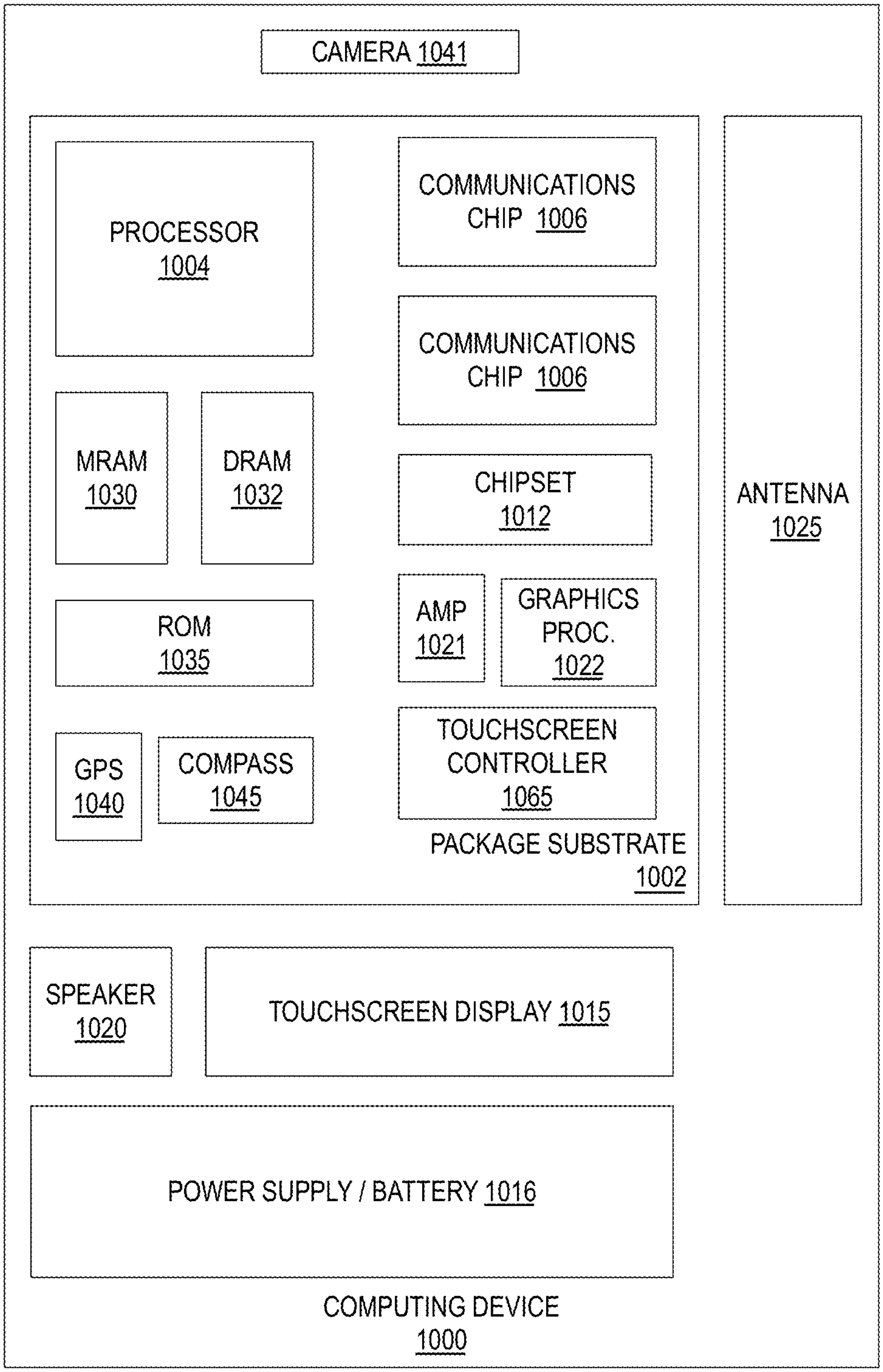
FIG. 10 is a functional block diagram of an electronic computing device, all arranged in accordance with at least some implementations of the present disclosure.

FIG. 10 is a functional block diagram of an electronic computing device 1000, in accordance with some embodiments. For example, device 1000 may, via any suitable component therein, employ a multi-layer AFE capacitor in accordance with any embodiments described elsewhere herein. Device 1000 further includes a motherboard or package substrate 1002 hosting a number of components, such as, but not limited to, a processor 1004 (e.g., an applications processor). Processor 1004 may be physically and/or electrically coupled to package substrate 1002. In some examples, processor 1004 is within an IC assembly that includes a multi-layer AFE capacitor as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the package substrate 1002. In further implementations, communication chips 1006 may be part of processor 1004. Depending on its applications, computing device 1000 may include other components that may or may not be physically and electrically coupled to package substrate 1002. These other components include, but are not limited to, volatile memory (e.g., DRAM 1032), non-volatile memory (e.g., ROM 1035), flash memory (e.g., NAND or NOR), magnetic memory (MRAM 1030), a graphics processor 1022, a digital signal processor, a crypto processor, a chipset 1012, an antenna 1025, touchscreen display 1015, touchscreen controller 1065, power supply/battery 1016, audio codec, video codec, power amplifier 1021, global positioning system (GPS) device 1040, compass 1045, accelerometer, gyroscope, speaker 1020, camera 1041, and mass storage device (such as hard disk drive, solid-state drive (SSD), compact disk (CD), digital versatile disk (DVD), and so forth, or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including, but not limited to, those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

The following pertain to exemplary embodiments.

In one or more first embodiments, an apparatus comprises a first electrode comprising a first metal, a second electrode comprising the first metal or a second metal, and an anti-ferroelectric material stack between the first and second electrodes, the anti-ferroelectric material stack comprising a first layer comprising hafnium and oxygen, a second layer comprising cerium and oxygen, and a third layer comprising zirconium and oxygen.

In one or more second embodiments, further to the first embodiments, the second layer is directly on the first layer and the third layer is directly on the second layer.

In one or more third embodiments, further to the first or second embodiments, the anti-ferroelectric material stack comprises a plurality of multi-layer stacks each comprising the first layer, the second layer, and the third layer.

In one or more fourth embodiments, further to the first through third embodiments, the anti-ferroelectric material stack comprises not fewer than three of the multi-layer stacks.

In one or more fifth embodiments, further to the first through fourth embodiments, the anti-ferroelectric material stack comprises not fewer than three of the multi-layer stacks.

In one or more sixth embodiments, further to the first through fifth embodiments, a thickness of the second layer is not more than 15% of a sum of a thickness of the first layer and a thickness of the third layer.

In one or more seventh embodiments, further to the first through sixth embodiments, the thickness of the second layer is not greater than 0.5 nm.

In one or more eighth embodiments, further to the first through seventh embodiments, the thickness of the third layer is greater than the thickness of the first layer.

In one or more ninth embodiments, further to the first through eighth embodiments, the first metal comprises one of titanium, tungsten, tantalum, ruthenium, iridium, aluminum, copper, cobalt, chromium, molybdenum, nickel, gold, or platinum.

In one or more tenth embodiments, further to the first through ninth embodiments, the apparatus further comprises an interfacial layer between the anti-ferroelectric material stack and one of the first and second electrodes, the interfacial layer comprising oxygen and one of ruthenium, iridium, aluminum, titanium, indium, gallium, zinc, tantalum, lanthanum, or sodium.

In one or more eleventh embodiments, a device comprises a transistor coupled to a capacitor in accordance with any of the first through tenth apparatuses.

In one or more twelfth embodiments, an apparatus comprises a transistor coupled to a bit line and a word line and a capacitor coupled to the transistor and to a ground, wherein the capacitor comprises a first electrode, a second electrode, and an anti-ferroelectric material stack between the first and second electrodes, the anti-ferroelectric material stack comprising a plurality of multi-layer stacks, each comprising a first layer comprising an oxide of hafnium, a second layer comprising an oxide of cerium on the first layer, and a third layer comprising an oxide of zirconium on the second layer.

In one or more thirteenth embodiments, further to the twelfth embodiments, the anti-ferroelectric material stack comprises not fewer than three of the multi-layer stacks.

In one or more fourteenth embodiments, further to the twelfth or thirteenth embodiments, the first electrode comprises titanium nitride.

In one or more fifteenth embodiments, further to the twelfth through fourteenth embodiments, a thickness of the second layer is not more than 15% of a sum of a thickness of the first layer and a thickness of the third layer.

In one or more sixteenth embodiments, further to the twelfth through fifteenth embodiments, the thickness of the third layer is greater than the thickness of the first layer.

In one or more seventeenth embodiments, further to the twelfth through sixteenth embodiments, the apparatus further comprises an interfacial layer between the anti-ferroelectric material stack and one of the first and second electrodes, the interfacial layer comprising an oxide of ruthenium, an oxide of iridium, an oxide of aluminum, an oxide of titanium, an oxide of indium, an oxide of tantalum, an oxide of lanthanum, an oxide of sodium, or an oxide of indium, gallium, zinc.

In one or more eighteenth embodiments, a system comprises a processor, a memory coupled to the processor, the memory comprising an anti-ferroelectric material stack between two electrodes, wherein the anti-ferroelectric material stack comprises a first layer comprising hafnium and oxygen, a second layer comprising cerium and oxygen, and a third layer comprising zirconium and oxygen, and a power supply coupled to the processor and/or the memory.

In one or more nineteenth embodiments, further to the eighteenth embodiments, the anti-ferroelectric material stack comprises not fewer than three multi-layer stacks each comprising the second layer on the first layer, and the third layer on the second layer.

In one or more twentieth embodiments, further to the eighteenth or nineteenth embodiments, the two electrodes each comprises a layer of titanium and nitrogen adjacent the anti-ferroelectric material stack.

In one or more twenty-first embodiments, further to the eighteenth through twentieth embodiments, a thickness of the second layer is not more than 15% of a sum of a thickness of the first layer and a thickness of the third layer, and the thickness of the third layer is greater than the thickness of the first layer.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:

a first electrode comprising a first layer and a second layer, the first layer comprising titanium nitride, and the second layer comprising a first metal;

a second electrode comprising the first metal or a second metal; and an anti-ferroelectric material stack between the first layer of the first electrode and the second electrode, the anti-ferroelectric material stack comprising a hafnium oxide layer, a cerium oxide layer on the hafnium oxide layer, and a zirconium oxide layer on the cerium oxide layer.

2. The apparatus of claim 1, wherein the anti-ferroelectric material stack comprises a plurality of multi-layer stacks each comprising the hafnium oxide layer, the cerium oxide layer on the hafnium oxide layer, and the zirconium oxide layer on the cerium oxide layer.

3. The apparatus of claim 2, wherein the anti-ferroelectric material stack comprises not fewer than three of the multi-layer stacks.

4. The apparatus of claim 1, wherein a thickness of the cerium oxide layer is not more than 15% of a sum of a thickness of the hafnium oxide layer and a thickness of the zirconium oxide layer.

5. The apparatus of claim 4, wherein the thickness of the cerium oxide layer is not greater than 0.5 nm, and wherein the thickness of the zirconium oxide layer is greater than the thickness of the hafnium oxide layer.

6. The apparatus of claim 1, wherein the first layer of the first electrode is on the zirconium oxide layer.

7. The apparatus of claim 1, wherein the first metal comprises one of titanium, tungsten, tantalum, ruthenium, iridium, aluminum, copper, cobalt, chromium, molybdenum, nickel, gold, or platinum.

8. The apparatus of claim 1, further comprising an interfacial layer between the anti-ferroelectric material stack and the first electrode, the interfacial layer comprising oxygen and one of ruthenium, iridium, aluminum, titanium, indium, gallium, zinc, tantalum, lanthanum, or sodium, wherein the first layer of the first electrode is on the interfacial layer, and the interfacial layer is on the zirconium oxide layer.

9. The apparatus of claim 1, wherein the first layer of the first electrode has a thickness of not more than 5 nm.

10. The apparatus of claim 1, further comprising:

an integrated circuit (IC) die comprising a transistor and a capacitor, the capacitor comprising the first electrode, the second electrode, and the anti-ferroelectric material stack; and a power supply coupled to the IC die.

11. An apparatus, comprising:

a first electrode comprising a first layer and a second layer, the first layer comprising a nitride of titanium;

a second electrode; and an anti-ferroelectric material stack between the first layer of the first electrode and the second electrode, the anti-ferroelectric material stack comprising a plurality of multi-layer stacks, each comprising a first layer, a second layer on the first layer, and a third layer on the second layer, the first layer comprising an oxide of hafnium, the second layer comprising an oxide of cerium, and the third layer comprising an oxide of zirconium.

12. The apparatus of claim 11, wherein a thickness of the second layer is not more than 15% of a sum of a thickness of the first layer and a thickness of the third layer.

13. The apparatus of claim 12, wherein the thickness of the second layer is not greater than 0.5 nm.

14. The apparatus of claim 13, wherein the thickness of the third layer is greater than the thickness of the first layer.

15. The apparatus of claim 11, wherein the anti-ferroelectric material stack comprises not fewer than three of the multi-layer stacks.

16. The apparatus of claim 11, wherein the first layer of the first electrode is on the third layer.

17. The apparatus of claim 11, wherein the second layer of the first electrode comprises one of titanium, tungsten, tantalum, ruthenium, iridium, aluminum, copper, cobalt, chromium, molybdenum, nickel, gold, or platinum.

18. The apparatus of claim 11, further comprising an interfacial layer between the anti-ferroelectric material stack and the first electrode, the interfacial layer comprising an oxide of one of ruthenium, iridium, aluminum, titanium, indium, gallium, zinc, tantalum, lanthanum, or sodium, wherein the first layer of the first electrode is on the interfacial layer, and the interfacial layer is on the third layer.

19. The apparatus of claim 11, wherein the first layer of the first electrode has a thickness of not more than 5 nm.

20. The apparatus of claim 11, further comprising:

an integrated circuit (IC) die comprising a transistor and a capacitor, the capacitor comprising the first electrode, the second electrode, and the anti-ferroelectric material stack; and a power supply coupled to the IC die.

* * * * *